United States Patent [19]

Neilson

[11] 4,158,206
[45] Jun. 12, 1979

[54] SEMICONDUCTOR DEVICE

[75] Inventor: John M. S. Neilson, Mountaintop, Pa.

[73] Assignee: RCA Corporation, New York, N.Y.

[21] Appl. No.: 859,181

[22] Filed: Dec. 9, 1977

[30] Foreign Application Priority Data

Feb. 7, 1977 [GB] United Kingdom ............... 04942/77

[51] Int. Cl.² ............................................. H01L 29/90
[52] U.S. Cl. ...................................... 357/13; 357/52; 357/88
[58] Field of Search ............................. 357/13, 52, 88

[56] References Cited

U.S. PATENT DOCUMENTS 3,968,511 7/1976 Yagi et al. .............................. 357/36
4,003,072 1/1977 Matsushita et al. .................... 357/52

Primary Examiner—Edward J. Wojciechowicz
Attorney, Agent, or Firm—H. Christoffersen; D. S. Cohen; R. Ochis

[57] ABSTRACT

A semiconductor device comprises a body of semiconductor material having a PN junction terminating at a major surface thereof. At least one field limiting ring is within the body and extends around a portion of the PN junction. Each field limiting ring is spaced apart from the surface.

7 Claims, 2 Drawing Figures

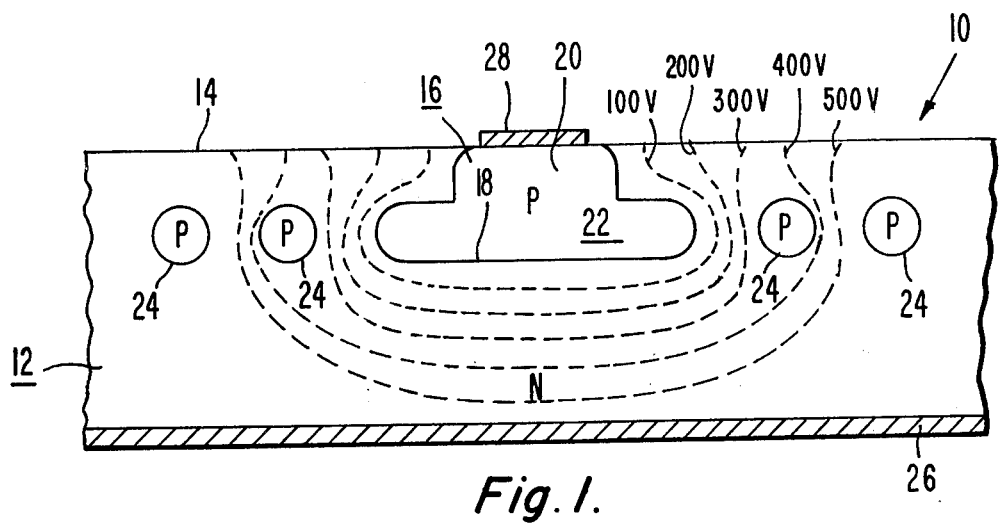
Fig. 1.
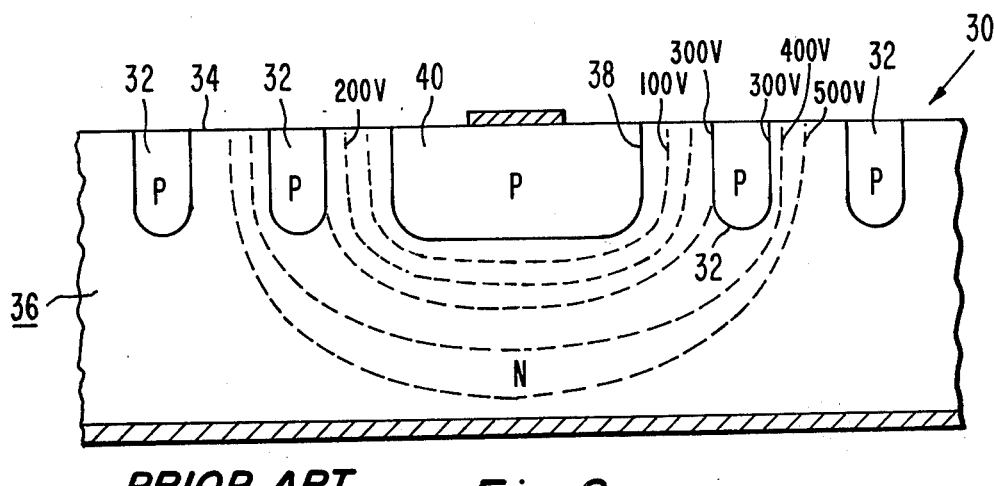
PRIOR ART    Fig. 2.

SEMICONDUCTOR DEVICE

The present invention generally relates to semiconductor devices and, in particular, relates to devices having at least one field limiting ring.

Many semiconductor devices, for example transistors or thyristors, have at least one PN junction therein which is reverse biased during the normal operation thereof. In a bipolar transistor for example, the reverse biased junction is usually the base-collector junction. The reverse bias voltage sustainable by such a junction is an important parameter in the design and fabrication of such a device and is usually surface limited, i.e., limited because of excess charges and increased field intensity at the device surface. Field limiting rings, i.e., regions which serve to reduce the electric field intensity at the surface intercept of the reverse biased PN junction, are often introduced to increase the reverse bias voltage sustainable by the PN junction of interest. The ultimate goal of such rings is to insure that the PN junction breaks down, if at all, at the bulk breakdown voltage of the semiconductor material.

Conventional field limiting rings, however, are themselves surface limited to the degree that excess charges are always present at the surface intercepts thereof. Hence, while the reverse bias breakdown voltage of the PN junction is improved it nevertheless remains surface limited. The usual solution to the problem of surface charge is to provide better surface passivation to reduce the number of mobile charges thereat. One such solution is described in U.S. Pat. No. 3,971,061 issued to Matsushita et al. on July 20, 1976, wherein a layer of high-resistivity polycrystalline silicon material is used as a passivant over the field limiting rings.

A device embodying the principles of the present invention eliminates the problems associated with the surface charges accompanying field limiting rings.

In the drawing:

FIG. 1 is a partial cross-sectional view of one embodiment of a semiconductor device, not drawn to scale, embodying the principles of the present invention.

FIG. 2 is a partial cross-sectional view of a device having conventional field limiting rings, not drawn to scale.

A semiconductor device, indicated generally at 10 in FIG. 1, embodying the principles of the present invention, comprises a body 12 of semiconductor material having a surface 14. The body 12 has a first type conductivity, for example N type, and is preferably silicon. It is understood that the body 12 can just as well be P type material so long as all other conductivity types mentioned herein are likewise changed. Specifically, the body 12 can have a dopant concentration on the order of about $10^{14}$ carriers/cm$^3$.

A first region 16 having a second type conductivity, in this example P type, is adjacent the surface 14 of the body 12. In one embodiment the first region 16 has an average sheet resistance on the order of about 500 ohms per square. The first region 16 forms a PN junction 18 with the body 12 at the interface therebetween. The PN junction 18 extends to, and terminates at, the surface 14. Preferably, for reasons more fully discussed below, the first region 16 comprises a first portion 20 and a second portion 22. In the preferred embodiment, the first portion 20 is adjacent the surface 14 and has a comparatively smaller lateral extent than the second portion 22, the second portion 22 being spaced apart from the surface 14 by the first portion 20. It is preferred that the first portion 20 be substantially centrally positioned with respect to the second portion 22. In this embodiment the first portion 20 can have a depth, measured substantially perpendicularly to the surface 14, on the order of about 12 micrometers. In such an instance the second portion 22 can have a depth on the order of 40 micrometers where it overextends the first portion 20.

At least one second region 24 having the second type conductivity is completely within the body 12 and extends around a portion, preferably the second portion 22, of the first region 16. Each second region 24 is spaced apart from the first region 16 and from each other second region 24. Preferably, the second regions 24 lie in an imaginary plane which passes through the first region 16 and is substantially parallel with the surface 14. In the preferred embodiment the second regions 24 have about the same depth as the second portion 22 and lie in the same imaginary plane, the imaginary plane being substantially parallel with the surface 14. As a result, in this embodiment, the second regions 24 are spaced apart from the surface 14 by a depth which is about equal to the depth of the first portion 20. Preferably, although not necessarily, any two adjacent second regions 24 are spaced apart a distance which allows the depletion region to extend completely across the separation between them at a voltage substantially below the avalanche voltage of the PN junction 18. For example, with the stated concentration of $10^{14}$ carriers/cm$^3$, a suitable spacing would be about 50 micrometers since this would result in depletion between adjacent second region 24 at a voltage of approximately 200 volts, with a peak electric field of approximately 8 volts per micrometer, which is approximately 40% of the avalanche field. In addition, the spacing between any two adjacent second regions 24 should be about equal to the spacing between the innermost second region 24 and the PN junction 18.

A first electrode 26 overlies and electrically contacts the body 12 of semiconductor material. A second electrode 28 overlies and electrically contacts the first region 16 of the device 10. The first and second electrodes, 26 and 28 respectively, provide means whereby a reverse bias potential can be applied to the PN junction 18. Upon the application of such a biasing arrangement a depletion region is formed about the PN junction 18.

To more fully explain the operational principles of the present invention a discussion on the expansion of a depletion region in a conventional device, shown at 30 in FIG. 2, having field limiting rings 32 which terminate at a surface 34 of a body 36, follows. The usual cross-hatching has been omitted from the drawing to permit a clearer representation of various equipotential lines.

As shown, the equipotential lines represent the loci of all points at the specified intermediate voltages within the depletion region formed in response to a given reverse bias voltage across a PN junction 38 between the body 36 and a first region 40 therein. While the depletion region is formed on both sides of the PN junction 38 only the expansion on the side having the field limiting rings 32 is of interest to this discussion. As known in the art, the depletion region encompassed by its leading edge and the PN junction 38 is free of mobile charges. That is, a number of free charges sufficient to counterbalance the reverse bias voltage must be removed to form the depletion region. As a result, the distance between the PN junction 38 and the leading edge of the depletion region is dependent on the number of mobile charges in the material around that PN junction 38. The electric field strength of any point in the depletion region is inversely proportional to the spacing between equipotential lines at that point. That is, where the equipotential lines are further apart, the electric field strength is comparatively lower. A lower electric field strength at the surface, and hence a more stable surface 34, is the primary objective of this or any surface protection system.

As qualitatively shown in FIG. 2 the equipotential lines at the surface 34 are spaced further apart where they intersect that surface 34 than within the body 36 of the device 30. That is, for example, the distance between the 300 volt line and the 400 volt line is greater where these lines intersect the surface 34 than within the body 36 beneath region 40. This expansion of the depletion region is due to the presence of the field limiting rings 32 which limit the voltage between the region 40 and the first ring 32 to that voltage which produces "punchthrough" or depletion of the space between these two regions. Similarly, the depletion region limits the voltage between adjacent rings 32 to that voltage necessary to produce depletion between them. In the situation illustrated, which represents a substantially zero surface charge, the field limiting rings 32 quite adequately reduce the electric field strength at the surface 34. However, if the surface 34 is contaminated with either positive or negative ions, depletion across the space between the rings 32 occurs at a voltage which is greater or lesser than the intended value, i.e., the voltage is no longer distributed uniformly between rings 32, and an excessive electric field is produced at the inside or outside edge of the rings 32. This condition results in a relatively low voltage breakdown PN junction 38 at some point along the surface 34. This sensitivity to ionic surface contamination results from the surface location of the point of closest approach between rings 32. This location allows the voltage between the rings 32 to be influenced not only by the charges within the semiconductor body 36, which can be very accurately controlled, but also by the very difficult-to-control charges on the surface 34 of the semiconductor body 36.

The elimination of the above-described problem is clearly shown in FIG. 1 of the drawing wherein equipotential lines similar to those of FIG. 2 are shown. It is easily observed that the surface separation between the 300 volt line and the 400 volt line, and hence the separation between the 400 volt line and the PN junction 18, is comparatively wider than for the same equipotential lines of the device 30 shown in FIG. 2. This spreading results from the geometry which causes the depletion region to expand vertically toward the surface 14 at the same time as it is expanding horizontally toward the second regions 24, since the second regions 24, i.e., hereinafter designated as the field limiting rings of the device 10, do not intercept the surface 14. Thus, the electric field intensity at the surface 14 is comparatively smaller than that at the surface 34 of a conventional device 30 for a given reverse bias voltage. Additionally, and more importantly, the initial depletion between rings 24 which establishes the voltage between rings 24, occurs within the body 12 of the device 10 rather than at the surface 14, because the point of minimum distance between the rings 24 is within the body 12 rather than at the surface 14. Thus, the voltage distribution between the rings 24 in device 10 is always the same, independent of ionic contamination on the surface, while, as noted above, the voltage distribution between the rings 32 on device 30 remains highly sensitive to ionic surface contamination. Hence, device 10 is capable of withstanding much larger concentrations of ionic surface contamination than device 30 without loss of the voltage distributing effect of the field limiting rings 24.

In the preferred embodiment the increased spreading of the depletion region in the vicinity of the second regions 24 during the initial depletion of the device 10, i.e., at comparatively lower reverse bias voltages, has a reduced field intensity at the surface 14 than in the conventional device 30. This is due to the second portion 22 of the first region 16 extending beyond the first portion 20 thereof. Operationally, by extending the second portion 22 beyond the first portion 20 the numer of mobile charges near the PN junction 18, which must be removed in the general vicinity of where that PN junction 18 intercepts the surface 14 is reduced. Since the number of mobile charges are reduced, i.e., because of the comparatively smaller perimeter of the intercept of the PN junction 18, the depletion region expands further along the surface 14 than in the conventional device 30. Thus, there is a further reduction in the electric field intensity at the surface intercept of the PN junction 18 which further improves the breakdown capability of that PN junction 18.

Still further, the reduced field intensity at the surface 14 and the fact that the second regions 24 do not intersect the surface 14 combine to provide a PN junction 18 having a comparatively smaller junction leakage current, with respect to a conventional device, thereacross. For example, since most junction leakage current usually occurs at the surface intercept of a PN junction, only those mobile charges in the vicinity of the PN junction 18 itself are available to be moved thereacross by a reverse bias voltage. However, in the conventional device 30 it is easily understood that most, if not all, of the mobile charges in the vicinity of the surface intercepts of the field limiting rings 32 are also potential contributors to leakage current across the PN junction 38.

The principles of the present invention are equally applicable to most semiconductor devices, e.g., transistors, thyristors or the like, and can be used to provide devices having improved breakdown characteristics.

What is claimed is:

1. A semiconductor device comprising:
   a body of semiconductor material having a surface and having a first type conductivity;
   a first region having a second type conductivity within said body and comprising a first portion and a second portion contiguous with said first portion, said second portion being spaced apart from said surface by said first portion and said second portion having a greater lateral extent than said first portion, said first region forming a PN junction with the remainder of said body at the interface therebetween, said PN junction terminating at said surface, and
   at least one second region having said second type conductivity within said body and spaced apart from said surface, said second region being spaced from and substantially completely extending around a portion of said first region.

2. A semiconductor device as claimed in claim 1 wherein:
   each said second region is spaced apart from each other said second region.

3. A semiconductor device as claimed in claim 1 further comprising:
   means whereby a reverse bias potential can be applied across said PN junction, whereby a depletion region forms around said PN junction upon the application of said means.

4. A semiconductor device as claimed in claim 3 wherein:
   said second region is spaced from said PN junction a distance such that said depletion region encompasses the second region nearest said first region prior to said PN junction breaking down.

5. A semiconductor device as claimed in claim 1 wherein:
   said second regions are coplanar.

6. A semiconductor device as claimed in claim 5 wherein:
   said second regions are coplanar with said second portion.

7. A semiconductor device as claimed in claim 6 wherein:
   said first portion is substantially centrally positioned with respect to said second portion.

* * * * *